US005355276A

United States Patent [19]

Chal

[11] Patent Number: 5,355,276

[45] Date of Patent: Oct. 11, 1994

[54] NETWORK CONNECTOR FOR COMPUTER

[76] Inventor: Ming-Kuang Chal, 3F-8, No.255, Sec.2, Chung-Shan Rd., Chung-Ho, Taiwan

[21] Appl. No.: 68,726

[22] Filed: May 26, 1993

[30] Foreign Application Priority Data

Jul. 16, 1992 [TW] Taiwan .............................. 81209443

[51] Int. Cl.[5] ...................... H01R 13/648; H05K 5/03

[52] U.S. Cl. .................................... 361/679; 361/641; 361/753; 361/823; 439/95; 439/108

[58] Field of Search .................. 174/51; 439/386, 620, 439/892, 926, 92, 95, 108; 361/679, 683, 686, 600, 622, 624, 641, 657, 752, 753, 796, 799, 803, 823

[56] References Cited

U.S. PATENT DOCUMENTS 5,077,630 12/1991 Bina .................................... 361/119
5,160,273 11/1992 Carney ............................... 439/108
5,181,859 1/1993 Foreman ............................ 439/225

*Primary Examiner*—Gerald P. Tolin
*Attorney, Agent, or Firm*—Townsend and Townsend Khourie and Crew

[57] ABSTRACT

An elongated casing includes an elongated insulated seat which is disposed transverse to a longitudinal length of the casing and adjacent to one end thereof. The insulated seat has two spaced through bores that extend along a full longitudinal length to receive two conducting rods, four inlet holes that extend from a bottom of the insulated seat to communicate with the through bores, and a flat top surface. The flat top surface is provided with a T-shaped member, two inverted L-shaped members which cooperate with the T-shaped member to define two hooking units, and two recesses formed adjacent to a respective one of the hooking units. Two pairs of conducting pins are provided lengthwise in the elongated casing and which extend from the end towards another end of the casing. The conducting pins have upright insert portions that extend into the inlet holes of the insulated seat to contact the conducting rods.

1 Claim, 3 Drawing Sheets

NETWORK CONNECTOR FOR COMPUTER

BACKGROUND OF THE INVENTION

1. Field of the Invention

The invention relates to a connector, more particularly to a network connector which is easy to installed and which can provide a stable and secure connection.

2. Description of the Related Art

FIG. 1 is an illustration of a conventional network connector which is used to connect a computer and a computer network so as to effect a signal therebetween. The conventional network connector has a first end attached to the computer while two pairs of conducting pins are provided at a second contact end. When the second end of the conventional network connector of the computer is attached to another network connector of the computer network, the conducting pins of the two network connectors are interconnected so that communication can be established between the computer and the computer network. The conventional network connector includes an elongated insulated casing (A) that has a front contact end (A4), a rear contact end (A3) opposite to the front contact end (A4), a bottom (A5), an open top (A6) opposite to the bottom (A5) and a pair of opposed walls (A7) which interconnect the front and rear contact ends (A4, A3) to define the elongated casing (A). The front contact end (A4) has a stopping plate (A1) that extends frontwardly therefrom. Each of the opposed walls (A7) has two grooves (A2) that extend upwardly from the bottom (A5) and is located adjacent to the front contact end (A4). Two pairs of first and second conducting pins (A11) are disposed lengthwise on the bottom (A5) of the elongated casing (A) and extend rearwardly from the front contact end (A4). The first conducting pin (A11) is shorter than the second conducting pin (A11). The first and second conducting pins (A11) are alternatingly arranged. Each of the pins (A11) has a first end flushed with one another and connected to a cable (not shown) that is inserted into the casing (A) via the rear contact end (A3), and a second end. The second ends of the first and second conducting pins (A11) are respectively provided with a contact portion (A9). The contact portions (A9) of the first and second conducting pins (A11) are staggered relative to one another in a direction transverse to a longitudinal length of the elongated casing (A). When two conducting plates (B) are inserted into the grooves (A2) of the elongated casing (A), each of the conducting plates (B) contacts the contact portions (A9) of the first and second conducting pins (A11) of the first and second pairs.

A cover (C) is provided on the open top (A6) of the elongated casing (A) so as to close the former. The ground plates (C1), which are disposed on the cover (C), press against the conducting plates (B) so as to maintain the conducting plates (B) in constant contact with the contact portions (A9) of the conducting pins (A11).

A drawback of the conventional network connector is that it is difficult to form precisely the groove (A2) of the elongated casing (A) so as to receive the conducting plates (B) therein. Therefore, the conducting plates (B) may become loose, thereby disengaging the conducting plates (B) relative to the conducting pins (A11), and thus providing a poor connection between a computer and a computer network when the cover (C) is removed relative to the casing (A).

SUMMARY OF THE INVENTION

A main objective of the present invention is to provide a network connector that has conducting elements which are connected securely to one another so as to provide a stable connection.

According to the present invention, a network connector includes an elongated insulated seat which is provided in an elongated casing adjacent to a front contact end thereof and which is transverse to a longitudinal length of the elongated casing. The insulated seat has two opposed ends, each having a projection inserted into the grooves of the elongated casing adjacent to the front contact end, two through bores that extend along a full length of the insulated seat to receive two conducting rods therein and four inlet holes that extend from a bottom of the insulated seat so as to communicate the through bores. The four inlet holes are staggered relative to an adjacent one of the inlet holes in a longitudinal axis of the insulated seat. Two pairs of first and second conducting pins are disposed lengthwise in the elongated casing adjacent to the front contact end and have upright insert portions that extend into the four inlet holes so as to connect with the conducting rods respectively. The insulated seat further has a flat top surface that is provided with a T-shaped member, two inverted L-shaped members which cooperate with the T-shaped member to define two hooking units, and two recesses which are formed adjacent to a respective one of the hooking units. A first end of two ground plates is clamped by a respective one of the recesses when the first end is inserted therein and has a downward projection which engages a respective one of the recesses so that the ground plates cannot move frontwardly and rearwardly of the elongated casing and lengthwise of the insulated seat. Second ends of the ground plates pass through the front contact end of the elongated casing and are prevented by the stopping plate of the front contact end from disengaging the elongated casing even through no cover member closes an open top thereof or when the elongated casing is upturned while the cover member is removed therefrom.

BRIEF DESCRIPTION OF THE DRAWINGS

Other features and advantages of the present invention will become more apparent in the following detailed description of the preferred embodiment with reference to the accompanying drawings, in which.

DETAILED DESCRIPTION OF THE PREFERRED EMBODIMENTS

Figure 1:
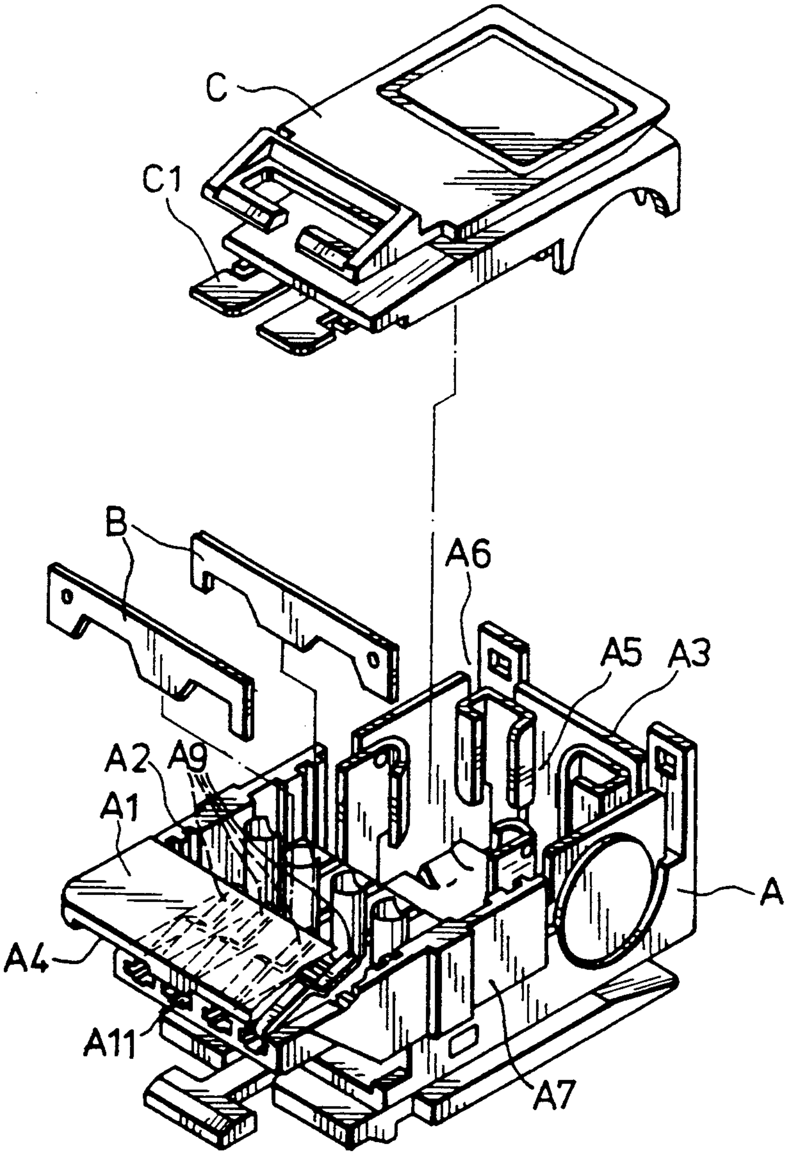
FIG.1 (PRIOR ART)
FIG. 1 is a partially exploded view of a conventional network connector which is used to connect a computer and a computer network.
Figure 2:
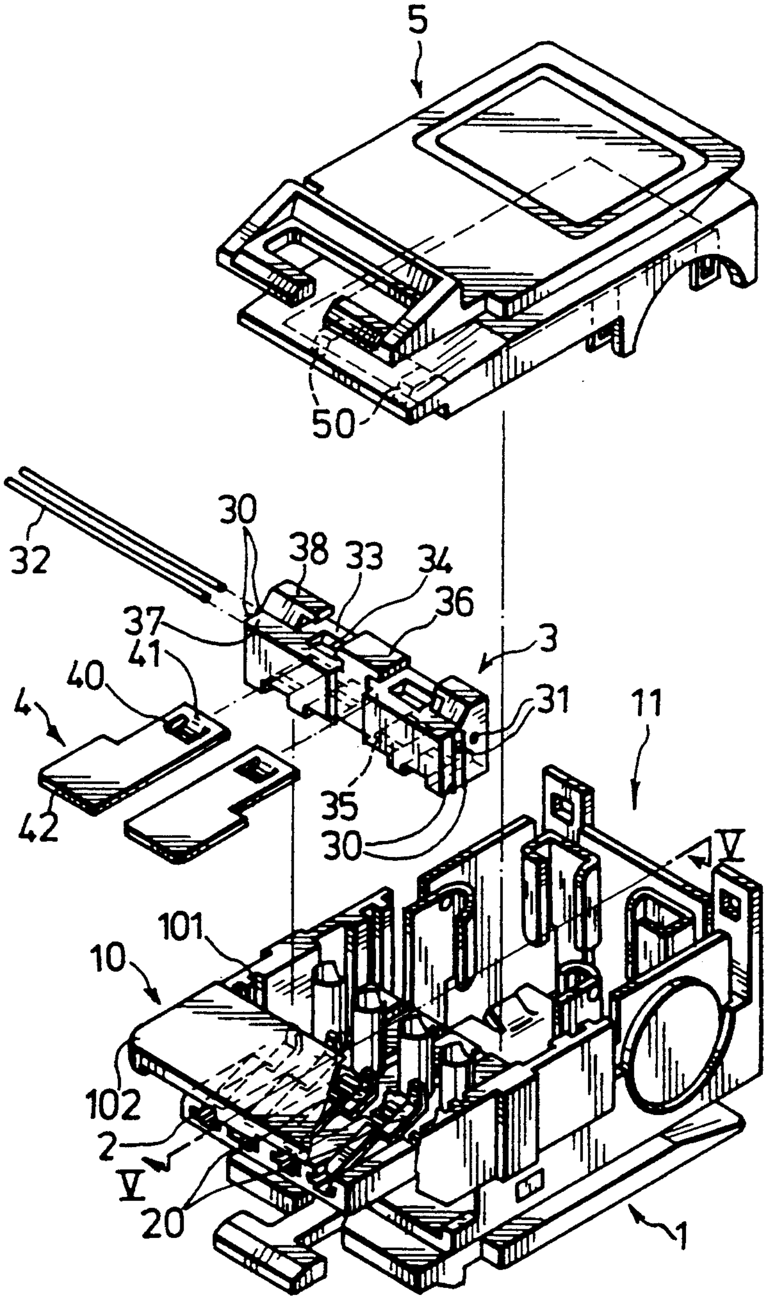
FIG. 2 is an exploded view of a first preferred embodiment of a network connector of the present invention.
Figure 3:
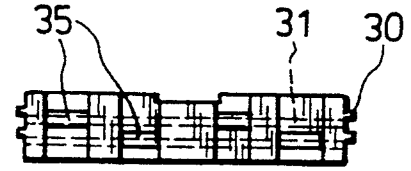
FIG. 3 shows an enlarged bottom view of an insulated seat that is employed in the first preferred embodiment of present invention.

Referring to FIG. 2, a network connector of the present invention includes an elongated casing (1), two pairs of conducting pins (2), an insulated seat (3), two ground plates (4) and a cover member (5).

The elongated casing (1) has a front contact end (10), a second contact end (11) opposite to the front contact end (10), and two elongated grooves (101) formed adjacent to the front contact end (10). The front contact end (10) is further provided with a stopping plate (102) that extends frontwardly therefrom.

The conducting pins (2) employed in the present preferred embodiment are arranged in the same manner as the conventional network connector so that a detailed description thereof is omitted herein. Each of the conducting pins (2) of the first and second pairs has an insert portion (20) that extends upwardly and that is staggered with respect to an adjacent insert portion (20) in a direction transverse to a longitudinal length of the elongated casing (1).

The insulated seat (3) has two opposed face ends each of which is provided with two parallel projections (30) that are transverse to a longitudinal length of the seat (3). The projections (30) of the insulated seat (3) are inserted into the grooves (101) of the elongated casing (1). The insulated seat (3) further has two spaced through bores (31) that extend along a full length of the insulated seat (3) to receive respectively two conducting rods (32) therein, four inlet holes (35) that extend from a bottom of the insulated seat (3) to communicate the through bores (35), and a flat top surface (37). The flat top surface (37) is provided with a T-shaped member (36), two inverted L-shaped members (38) which are disposed on both sides of the T-shaped member (36) and which cooperate with the T-shaped member (36) to define two hooking units (33), and two recesses (34) respectively formed adjacent to the hooking units (33). Since each of the inlet holes (35) is staggered with respect to an adjacent inlet hole in the longitudinal direction of the insulated seat (3), the insert portions (20) of the conducting pins (2) of the first and second pairs can extend into the inlet holes (35) to connect with a respective one of the conducting rods (32).

Figure 4:
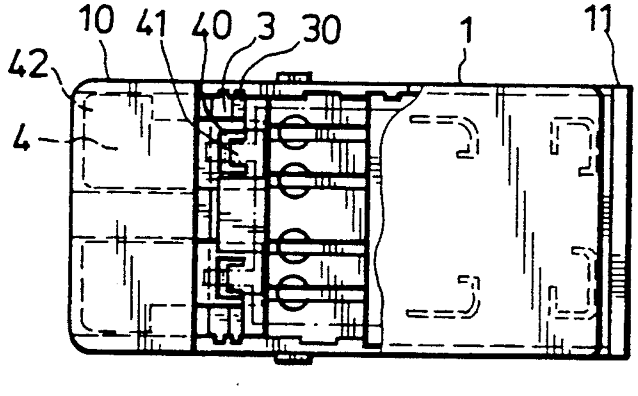
FIG. 4 shows a top view the network connector of the present invention with the top cover being removed partially to illustrate inner configuration.
Figure 5:
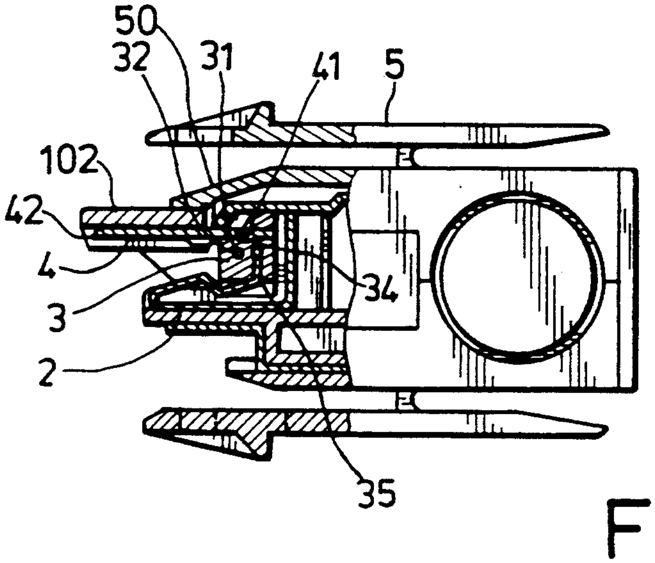
FIG. 5 shows a side view of partially cross section of the network connector taken along the line V—V of FIG. 2.

Each of the ground plates (4) has a first end (41) inserted into a respective one of the hooking units (33) so that the hooking unit (33) frictionally clamps the first end (41) . The first end (41) further has a downward projection (40) which engages the recess (34) of the flat top surface (37) so that the ground plate (4) cannot move frontwardly or rearwardly of the elongated casing (1) and along the length of the insulated seat (3). Thus, the ground plate (4) is fixed securely to the insulated seat (3). A second end (42) of the ground plate (4) passes through the front contact end (10) and is disposed under the stopping plate (102) of the elongated casing (1), as shown in FIGS. 4 and 5, so that in the event that the insulated seat (3) is lifted relative to the elongated casing (1), the insulated seat (3) is prevented from disengaging with the elongated casing (1).

The cover member (5) has a metal slip (50) attached thereto. One end of the slip (50) contacts the second end (41) of the ground plate (4) when the cover member (5) is provided on an open top of the elongated casing (1) to form an enclosed casing. As to which component a second end of the metal slip (50) is connected to is not concerned with the present invention, and thus, a detailed description is not omitted here.

Since the conducting elements in the network connector of the present invention are interconnected firmly, a stable connection will be established when the present invention used to connect a computer and a computer network. In addition, when repairing of the present invention is to be effected, the cover member (5) can be removed without causing any loose connection between the conducting elements.

While a preferred embodiment has been described and illustrated, it will be apparent that many changes and modifications can be made in the general construction and arrangement of the present invention without departing from the scope and spirit thereof. Therefore, it is desired that the present invention be not limited to the exact disclosure but only to the extent of the appended claims.

I claim:

1. A network connector for connecting a computer to a network, said connector comprising:

an elongated insulated casing including a front contact end, a rear contact end opposite to said front contact end, a bottom, an open top opposite to said bottom and a pair of opposed walls which interconnect said front and rear contact ends to define said elongated casing, said front contact end having a top portion which is provided with a stopping plate that extends frontwardly therefrom;

each of said opposed walls having an elongated groove which is formed adjacent to said front contact end and which extends from said bottom of said elongated casing to said open top of said elongated casing;

two pairs of first and second conducting pins which are disposed lengthwise on said bottom and which extend rearwardly from said front contact end, said first conducting pins being shorter than said second conducting pins, said first and second conducting pins of said two pairs being alternatingly arranged and each of which having a first end flushed with one another and a second end, said second ends of said first and second conducting pins being provided with an insert portion that extends upward, said insert portions of said second ends of said first conducting pins being staggered relative to said insert portions of said second ends of said second conducting pins in a direction transverse to a longitudinal axis of said elongated casing;

an elongated insulated seat provided in said elongated casing transverse to said longitudinal axis of said elongated casing, said insulated seat having two opposed ends, each of which is provided with a projection, said projections being inserted into said elongated grooves of said elongated casing respectively, said insulated seat further having a flat top surface provided with a T-shaped member and two inverted L-shaped members, each of which is disposed on both sides of said T-shaped member so as to define two hooking units, two spaced through bores that extend along a full length of said insulated seat so as to pass through said opposed ends, four inlet holes which extend from a bottom of said insulated seat to communicate said through bores, each of said four inlet holes being staggered relative to one another along the length of said elongated insulated seat so as to permit said insert portions of said second ends of said first and second conducting pins to extend therein, said flat top surface of said insulated seat being located lower than said stopping plate and having two recesses respectively formed adjacent to said hooking units;

two conducting rods inserted in said through bores in said insulated seat and respectively connecting said insert portions of said first conducting pins of said first and second pairs and said second conducting pins of said first and second pairs;

two ground conducting plates, each of which having a first end clamped by a respective one of said hooking units and a second end, a downward projection which is formed adjacent to said first end and which engages a respective one of said recesses of elongated insulated seat so that said ground conducting plate is fixed lengthwise of said elongated casing, said second end of said ground conducting plate passing through said front contact end so as to be disposed under said stopping plate such that said insulated seat is prevented from disengaging said elongated casing when said insulated seat is lifted from said elongated casing; and a cover member provided on said elongated casing so as to close said open top.

* * * * *